Sept. 29, 1964 W. FEISSEL 3,151,254

TRANSISTOR FOR HIGH FREQUENCY SWITCHING

Filed Feb. 14, 1961

United States Patent Office 3,151,254
Patented Sept. 29, 1964

3,151,254
TRANSISTOR FOR HIGH FREQUENCY SWITCHING

Wolfgang Feissel, Munich, Germany, assignor to Siemens & Halske Aktiengesellschaft Berlin and Munich, a corporation of Germany Filed Feb. 14, 1961, Ser. No. 89,262
Claims priority, application Germany Mar. 4, 1960
2 Claims. (Cl. 307—88.5)

This invention is concerned with a transistor adapted for use as a switch in connection with switching operations occurring with relatively high frequency.

Transistors, especially junction transistors, when used for the above indicated purpose, operate upon switching off with a saturation dalay which is in many cases troublesome. Such delay is produced by accumulation, in the base material, of charge carriers which are injected from the emitter and incompletely drawn off by the collector. This enrichment with charge carriers results after the switching-off operation of the transistor in temporary continuance of the current flow over the collector. This phenomenon is known as the "hole storage effect." Various circuits have been proposed for eliminating this effect or for largely limiting the operational consequences thereof.

The present invention proposes a transistor wherein the enrichment of the base zone with charge carriers beyond the absolutely necessary amount is to a great extent avoided, so that the transistor can be used particularly advantageously for highly frequent switching operations.

The transistor according to the invention comprises, in common with previously known transistors, a semiconductor with two border layers, each containing a pn-junction (collector-base and base-emitter junctions). As contrasted with previously known transistors of related type, the semiconductor (base) of the transistor according to the present invention is provided, preferably directly adjacent the collector junction, with a further pn-junction, hereinafter referred to as auxiliary collector, which is connected with a terminal maintained at a potential operative to draw off free charge carriers which otherwise would accumulate in the semiconductor.

The transistor of the present invention is for this purpose provided with an auxiliary electrode which is with respect to the base held at a potential corresponding in polarity to the collector potential and dimensioned so that the operation of the collector is not affected but that free charge carriers are drawn off.

In accordance with a further advantageous feature of the invention, this auxiliary collector electrode is arranged on a semi-conductor body ring-like about the collector electrode. However, it may also be arranged at the emitter side. It is likewise feasible to subdivide the collector and to use one part thereof as the collector and the other part as auxiliary collector.

While it is broadly known to provide transistors with more than three electrodes, the pn- or np-junctions are in the known arrangements either serially connected or the auxiliary pn-junction is, according to another previously proposed transistor embodiment, disposed so far away from thes collector that it cannot exert any influence on the operation of the collector as such or on the charge carrier accumulation within the semiconductor material.

The various objects and features of the invention will appear from the description which is rendered below with reference to the accompanying drawing.

Figure 1:
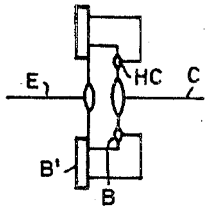
FIG. 1 shows an embodiment of a transistor according to the invention.

The transistor shown in FIG. 1 comprises a base B made of semiconductor material, to which the base potential is conducted over a metal ring B'. The emitter junction E and the collector junction C are in usual manner respectively provided as pn-junctions. A further ring-shaped electrode HC is disposed about the collector electrode C, such further electrode being according to the invention used as auxiliary collector electrode. The auxiliary collector electrode is in this example directly connected with the base electrode. The blocking layer potential of the pn-junction of the auxiliary collector electrode acts in such case as a draw-off potential.

Switching transistors are in customary arrangements used in emitter circuit as well as in base circuit. The potential for the auxiliary electrode can be obtained in each case from an individual auxiliary voltage source.

Figure 2:
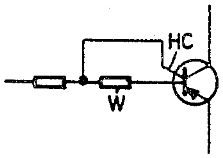
FIG. 2 shows a transistor connected in emitter circuit.

In accordance with FIG. 2, the voltage for the auxiliary collector is particularly advantageously obtained at a resistor W which is disposed ahead of the base, such resistor having a relatively low resistance, for example, about 100 ohm.

Figure 3:
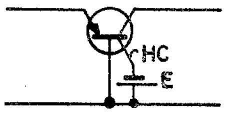
FIG. 3 shows a transistor connected in base circuit.

In the embodiment according to FIG. 3, there is provided an auxiliary voltage source E for the auxiliary collector HC.

The use of an auxiliary collector results in the advantage that practically all charge carriers which cannot exit over the normal collector, are drawn off. The auxiliary colector in a transistor corresponds to the space charge grid in a tube.

Changes may be made within the scope and spirit of the appended claims which define what is believed to be new and desired to have protected by Letters Patent.

I claim:

1. A transistor circuit for switching purposes in connection with relatively high frequencies, comprising a semi-conductor body forming a base zone and having oppositely disposed faces, an emitter electrode alloyed to one of said faces of said body, a collector electrode alloyed to the opposite face of said body, an annularly shaped auxiliary collector electrode disposed on the semiconductor body forming a further pn-junction in the immediate vicinity of the pn-junction of the collector electrode, and surrounding the latter, and means for applying a potential on said auxiliary electrode which lies between the base potential and the collector potential, the blocking layer potential of said further pn-junction being operative to draw off minority charge carriers accumulated in and enriching the base zone whereby such charge carriers are removed at said auxiliary collector electrode.

2. A transistor circuit according to claim 1, wherein said auxiliary electrode is electrically connected with the base electrode.

References Cited in the file of this patent

UNITED STATES PATENTS

| | | |
|---|---|---|
| 2,672,528 | Shockley | Mar. 16, 1954 |
| 2,923,870 | Zelinka | Feb. 2, 1960 |
| 2,994,810 | Gudmundsen | Aug. 1, 1961 |
| 2,998,534 | Pomerantz | Aug. 29, 1961 |
| 3,087,098 | Taylor | Apr. 23, 1963 |